Figure 1:
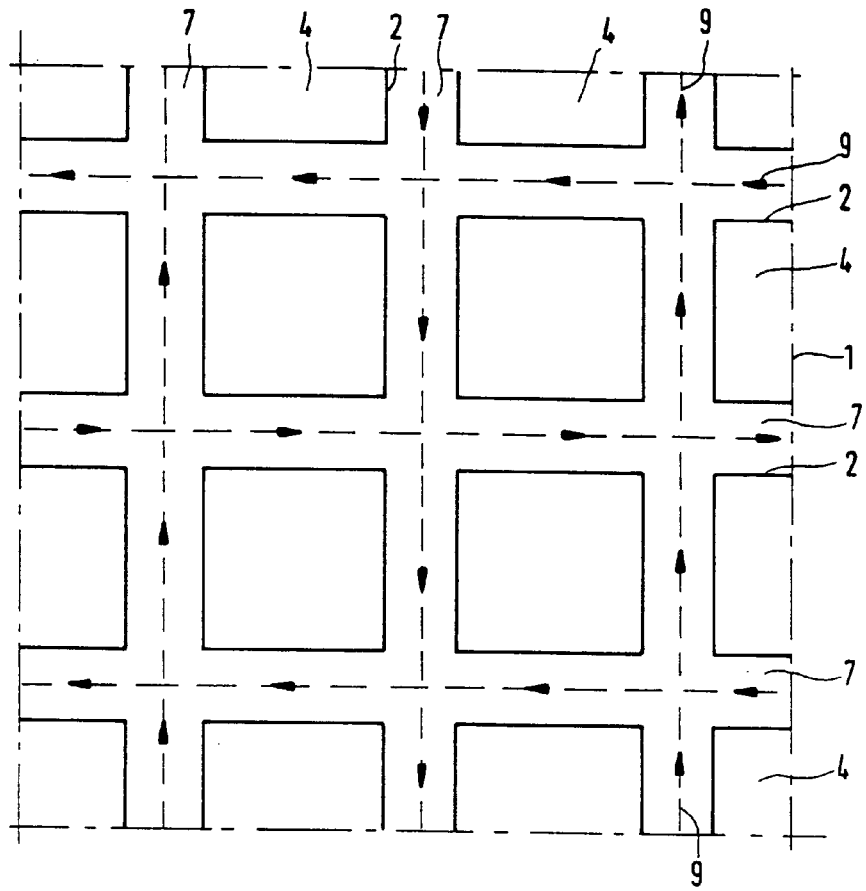

United States Patent

Broekroelofs

[19]

[11] Patent Number: 5,922,224
[45] Date of Patent: Jul. 13, 1999

[54] LASER SEPARATION OF SEMICONDUCTOR ELEMENTS FORMED IN A WAFER OF SEMICONDUCTOR MATERIAL

[75] Inventor: Jan C.E. Broekroelofs, Nijmegen, Netherlands

[73] Assignee: U.S. Philips Corporation, New York, N.Y.

[21] Appl. No.: 08/795,717

[22] Filed: Feb. 4, 1997

Related U.S. Application Data

[30] Foreign Application Priority Data

Feb. 9, 1996 [EP] European Pat. Off. ............. 96200305

[51] Int. Cl.$^6$ ................................................ B23K 26/00
[52] U.S. Cl. ........................................ 219/121.72; 438/463
[58] Field of Search ................... 219/121.67, 121.72, 219/121.77, 121.76, 121.68, 121.71, 121.69, 121.85; 438/113, 463

[56] References Cited

U.S. PATENT DOCUMENTS

| | | | |
|---|---|---|---|
| 3,112,850 | 12/1963 | Garibotti | 438/463 |
| 3,538,298 | 11/1970 | Duston et al. | 219/121.76 |
| 4,063,063 | 12/1977 | Funck et al. | 219/121.76 |
| 4,224,101 | 9/1980 | Tijburg et al. | 438/463 |
| 4,469,931 | 9/1984 | Macken | 219/121.72 |
| 4,782,208 | 11/1988 | Withrow et al. | 219/121.76 |
| 5,214,261 | 5/1993 | Zapella | 219/121.67 |
| 5,300,756 | 4/1994 | Cordingley | 219/121.69 |
| 5,365,032 | 11/1994 | Muller et al. | 219/121.67 |
| 5,367,530 | 11/1994 | Noishiki et al. | 372/43 |
| 5,543,365 | 8/1996 | Wills et al. | 438/463 |
| 5,633,735 | 5/1997 | Hunter, Jr. et al. | 219/121.68 |
| 5,641,416 | 6/1997 | Chadha | 219/121.69 |

FOREIGN PATENT DOCUMENTS

| | | | |
|---|---|---|---|
| 222232 | 5/1985 | Germany | 219/121.68 |
| 3705500A1 | 9/1988 | Germany . | |
| 59-25380 | 6/1984 | Japan | 219/121.85 |
| 59-31983 | 8/1984 | Japan | 219/121.69 |
| 60-215714 | 10/1985 | Japan | 219/121.77 |
| 2-89586 | 3/1990 | Japan | 219/121.69 |
| 2-220793 | 9/1990 | Japan | 219/121.67 |
| 2-299791 | 12/1990 | Japan | 219/121.77 |

OTHER PUBLICATIONS

"Prism Deflector for Laser Machining" by Kremen, IBM Technical Disclosure Bulletin, vol. 8, No. 6, p. 882, Nov. 1965.
"Two–Pass Laser Cutting" by Shah et al., IBM Technical Disclosure Bulletin, vol. 16, No. 10, p. 3237, Mar. 1974.
Abstract of USSR Patent document 1,820,398, published Jun. 7, 1993.

Primary Examiner—Geoffrey S. Evans
Attorney, Agent, or Firm—F. Brice Faller

[57] ABSTRACT

A method of separating semiconductor elements (2) formed in a wafer of semiconductor material (1). A score (8) is formed in a surface (3) of the wafer (1) through local evaporation of semiconductor material by heat originating from radiation (10). This radiation (10) is generated by a laser (11) and focused on the wafer (1) by an optical system (12). The wafer (1) is moved relative to the radiation (10) focused thereon along a path (9) which follows the score (8) to be formed. The radiation (10) of the laser (11) is focused on the wafer (1) in the form of at least two beams (14 and 15), the wafer (1) being moved relative to the beams (14 and 15) such that the beams (14 and 15) travel the same path (9) one after the other. A deeper score (8) can be formed than by an unsplit beam of the same energy as the two beams together.

7 Claims, 3 Drawing Sheets

LASER SEPARATION OF SEMICONDUCTOR ELEMENTS FORMED IN A WAFER OF SEMICONDUCTOR MATERIAL

The invention relates to a method of separating semiconductor elements formed in a wafer of semiconductor material, whereby a score is formed in a surface of the wafer by local evaporation of semiconductor material through heating by means of radiation generated by a laser and directed at the wafer by means of an optical system, the wafer being moved relative to the radiation directed thereto along a path which follows the score to be formed.

Semiconductor elements formed in the wafer, such as diodes, transistors, or integrated circuits, are usually separated from one another in practice by lanes of untreated semiconductor material, also called scribing lanes. The elements are then separated in that the wafer is subdivided into pieces along these lanes. This may be done by sawing the wafer into pieces, by forming a score in the above manner which cuts the wafer through its entire thickness, or by forming a score in the above manner which cuts only through part of the thickness of the wafer and subsequently breaking up the wafer by means of ultrasonic vibration.

The score may be formed by means of a laser which emits radiation continuously or a laser which does this in a pulsatory manner. In the former case, a score is formed which exhibits a substantially homogeneous depth throughout its length, in the latter case a score is formed consisting of a row of holes formed in the semiconductor material. The wafer is moved relative to the radiation directed thereto during the formation of the score. This may be achieved in that the wafer is moved while the optical system is stationary, or in that the optical system is moved while the wafer is stationary.

DE-A-37 05 500 discloses a method of the kind mentioned in the opening paragraph whereby the laser radiation is directed at the wafer in the form of a beam which hits the semiconductor body in an oval focal spot. The radiation in this case has a homogeneous density in said focal spot. The longitudinal axis of the focal spot lies in the direction of the score to be formed during the movement of the wafer.

A score of only a limited depth can be formed by means of the known method described. Problems may arise when the known method is used for breaking up comparatively thick wafers. The wafer may break locally along a breaking surface running through a semiconductor element if a score is used which is not deep enough during breaking of the wafer by means of ultrasonic vibration. It is found that this problem cannot be solved through the use of laser radiation of higher energy. The score formed then is hardly any deeper, while the semiconductor body next to the score may be damaged by overheating.

The invention has for its object inter alia to provide a method whereby semiconductor elements formed in a comparatively thick wafer of semiconductor material can be separated.

The method mentioned in the opening paragraph is for this purpose characterized in that the laser radiation is directed at the wafer in the form of at least two beams, while the wafer is moved relative to said beams such that said beams travel the same path one after the other.

It is found to be possible to form a deeper score in that the laser radiation is aimed at the wafer not in a single beam but in two or more beams, so that semiconductor elements formed in a comparatively thick wafer can be separated. It is suspected that the evaporation of semiconductor material owing to the laser radiation forms a gas cushion of evaporation products which absorbs the radiation emitted by the laser. Further evaporation of semiconductor material is counteracted thereby. When laser radiation of higher energy is used, a thicker gas cushion will be formed, so that the radiation is absorbed even more strongly and accordingly the evaporation is also counteracted more strongly. A score is formed then which is hardly any deeper than the score formed by laser radiation of lower energy. The evaporation will be hampered to a lesser degree when the laser radiation is aimed at the wafer in the form of at least two beams which travel the same path one after the other. The score is then formed in steps and will become deeper upon irradiation by each beam. Any gas cushion formed in the score by evaporation products can disappear between the steps. Moreover, the semiconductor body is capable of cooling down between steps, so that also the occurrence of damage caused by heating is counteracted.

Preferably, the wafer is moved relative to the beams such that the beams travel the same path with at least a 10 $\mu$s interval between them each time. The gas cushion which counteracts the formation of the score has apparently disappeared after a period of at least 10 $\mu$s, so that the evaporation can start unhampered in each fresh step.

It is found in practice that the radiation generated by a laser is not completely stable. When this radiation is aimed at the wafer in two beams, two focal points are formed which are not completely stationary. The result of this is that the second laser beam will not follow exactly the same path as the first laser beam during the movement of the wafer. The score formed could as a result become locally wider instead of deeper. A groove could be formed of a changing depth. This does not happen in practice, however, when the wafer is moved relative to the beams such that the beams travel the same path with at most 10 ms in between each time. The beams are apparently displaced so little in less than 10 ms that a groove is formed which has the same depth all along the path.

A further preferred embodiment of the method is characterized in that the laser radiation is aimed at the wafer by means of an optical system which has an optical plane transverse to the path to be traveled, relative to which plane the radiation is symmetrically split into beams. In a simple case, for example, the radiation is split up into two beams of equal energy which enclose equal angles with said optical plane. The wafer may now be moved in opposite directions in scribing lanes lying next to one another, so that scores in a wafer having many scribing lanes can be realized more quickly. The symmetry achieves that the wafer is irradiated in the same manner in both scribing lanes, so that a score of equal depth is formed in both scribing lanes. If such a symmetry were absent, the first beam would be, for example, stronger than the second, and the slice would be irradiated by a strong beam first and by a weak beam afterwards in the one direction, and in the other direction by a weak beam first and by a strong beam afterwards. Scores of different depths could be formed thereby.

Said symmetrical beam splitting may be realized in a simple manner in that the laser radiation is aimed at the wafer by means of an optical system with a binary phase diffraction grating.

In the manner described above, for example, a 12 $\mu$m wide and 105 $\mu$m deep score can be formed in a silicon wafer with a high speed of, for example, 25 cm per second. Semiconductor elements formed in a wafer of semiconductor material can thus be quickly separated. This separation speed can be doubled in that also radiation of a second, identical laser is aimed at the wafer in the form of at least two beams, the beams of the second laser traveling a path one after the other at an adjustable distance from and parallel to that of the beams of the first laser. Two parallel scores are then formed simultaneously. The interspacing thereof should be so adjusted that the two scores are provided exactly between semiconductor elements.

Figure 2:
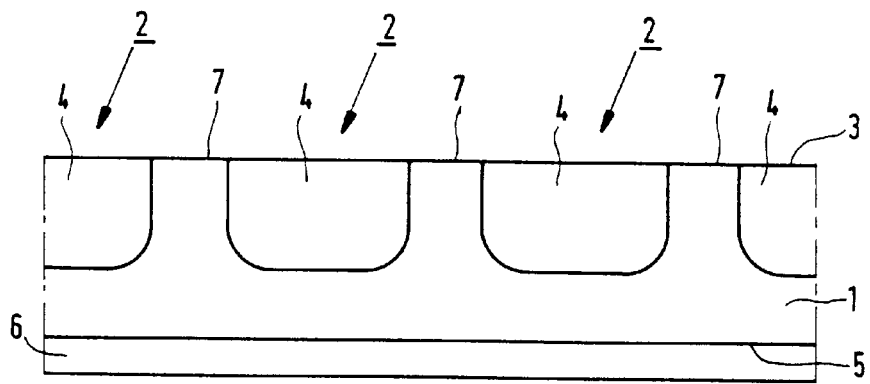
Figure 3:
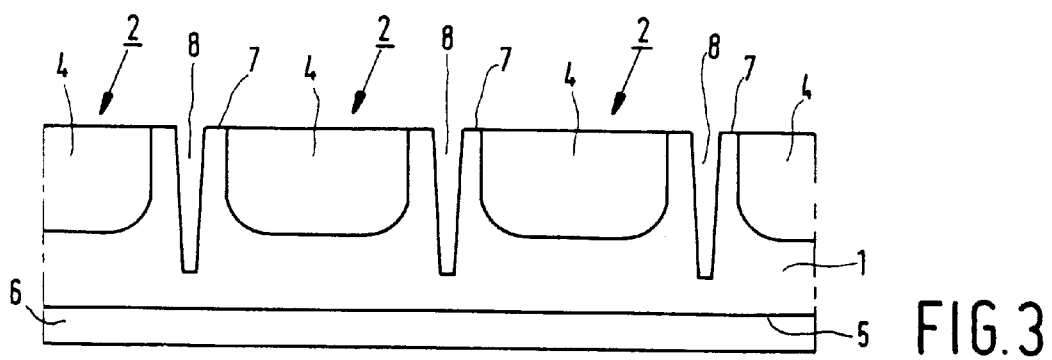
Figure 4:
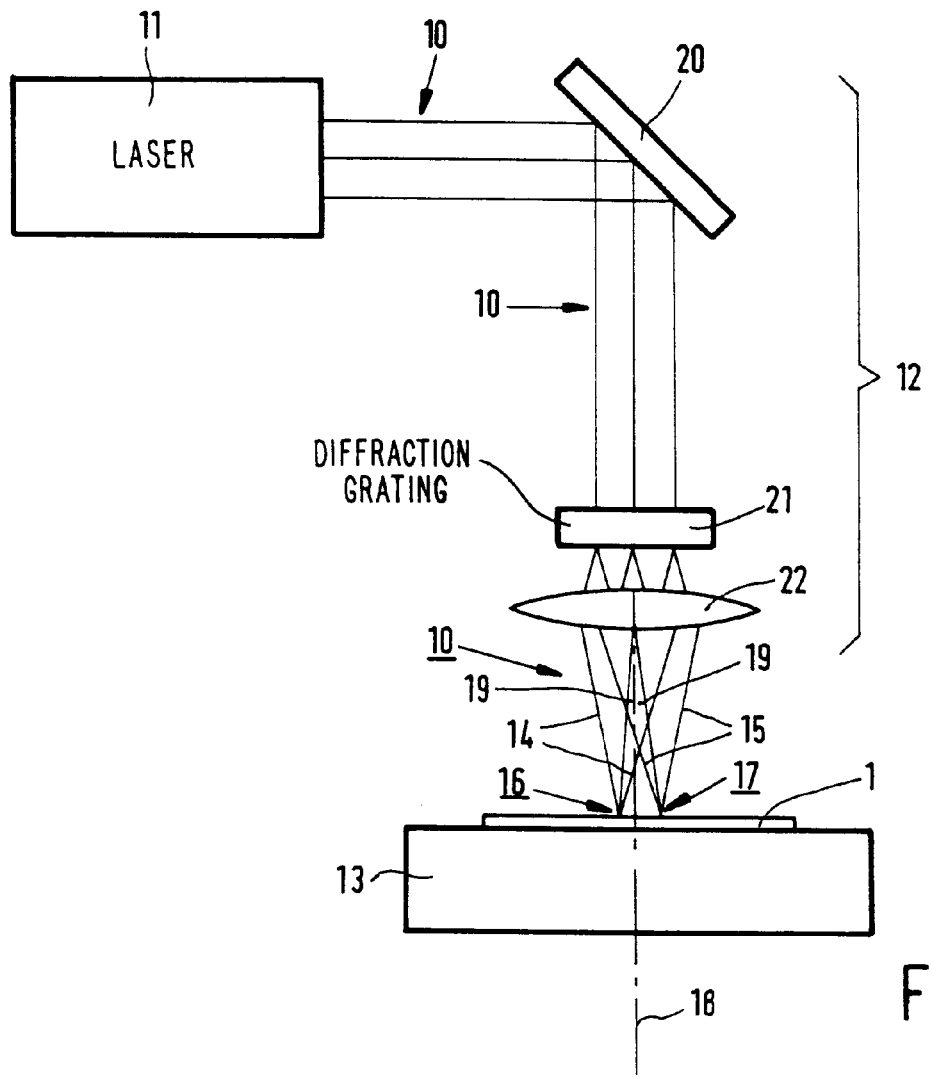
Figure 5:
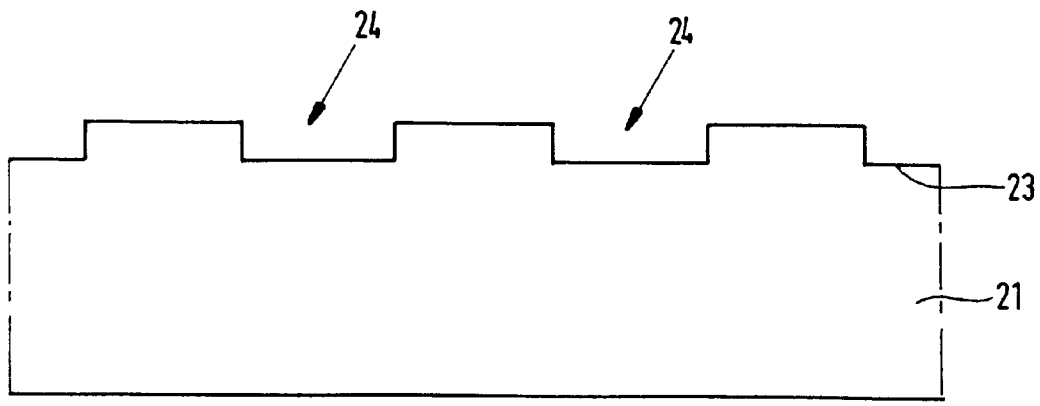
Figure 6:
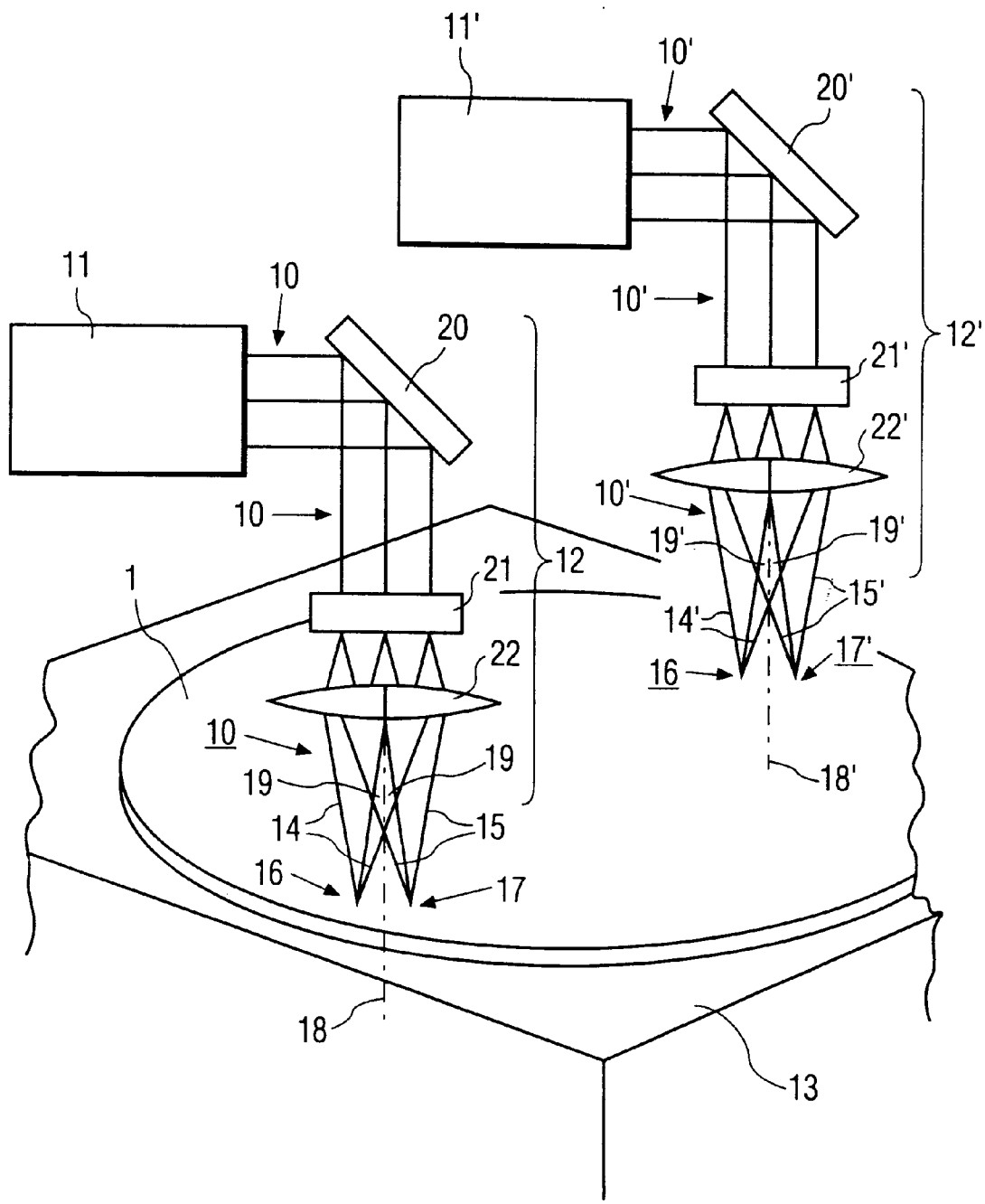

The invention will be explained in more detail below by way of example with reference to a drawing, in which:

FIG. 1 shows a portion of a semiconductor wafer in which semiconductor elements are formed, FIGS. 2 and 3 diagrammatically and in cross-section show a few stages in the separation of the semiconductor elements shown in FIG. 1 by the method according to the invention, FIG. 4 diagrammatically shows a device for separating the semiconductor elements by the method according to the invention, FIG. 5 is a diagrammatic cross-section of a binary phase diffraction grating which can be used in the optical system and FIG. 6 dramatically shows an additional device for separating the semiconductor elements according to the invention.

FIGS. 1 and 2 show part of a wafer of semiconductor material 1 in elevation and in cross-section, respectively, in this example an approximately 120 $\mu$m thick n-type silicon wafer in which semiconductor elements 2 are formed in usual manner, in this case diodes. The semiconductor elements 2 are formed in a surface 3 of the wafer 1 and comprise p-type semiconductor zones 4 of 240×240 $\mu$m. The wafer 1 is provided with a metal contact layer 6 at its rear 5. In this example, the semiconductor elements 2 are diodes, but they may alternatively be transistors or integrated circuits.

The semiconductor elements 2 are usually separated from one another in practice by lanes 7 of untreated semiconductor material. The elements 2 are split up in that the wafer 1 is subdivided into pieces along these lanes 7.

In this example, a score 8 is formed in each lane. Such a score 8 may cut through the entire thickness or, as in the present example, only through part of the thickness of the wafer. In the example given here, the wafer 1 is broken up into pieces after the formation of the score by means of ultrasonic vibration.

A score 8 is formed in the surface 3 of the wafer 1 by means of the device shown in FIG. 4. Semiconductor material is locally evaporated through heating with radiation 10 generated by a laser 11. The laser 11 in this embodiment is a 25 kHz pulsed, Q-switch YAG laser of 5 W with which radiation with a wavelength of 1.06 $\mu$m is generated. The radiation 10, which takes the form of a beam of 16 mm diameter, is focused on the wafer 1 by an optical system 12. The wafer 1 is here moved relative to the radiation 10 focused on it along a path 9 which is diagrammatically indicated with a broken line in FIG. 1 and which traces the score 8 to be formed. The wafer is for this purpose placed on a table 13 which can be moved relative to the radiation 10 aimed at the wafer. The path 9 is traversed in this example with a speed of approximately 25 cm per second.

In this example, the radiation of the laser 11 is aimed at the wafer 1 in the form of at least two beams 14 and 15, while the wafer 1 is so moved relative to the beams 14 and 15 that the beams 14 and 15 travel the same path 9 one after the other.

A deeper score 8 can be formed in that the radiation 10 of the laser 11 is directed at the wafer 1 not in a single beam but in two or more beams 14 and 15, compared with an unsplit beam of the same energy content. It is suspected that the evaporation of semiconductor material by the laser radiation forms a gas cushion of evaporation products which absorbs the radiation emitted by the laser. Further evaporation of semiconductor material is counteracted thereby. The use of laser radiation of higher energy will lead to a thicker gas cushion, so that the radiation is absorbed more strongly and accordingly the evaporation is also counteracted more strongly. A score is formed then which is hardly any deeper than the score formed with laser radiation of lower energy. When the laser radiation is aimed at the wafer 1 in the form of at least two beams 14 and 15 which travel the same path 9 one after the other, the evaporation will be hampered to a lesser degree. The score is then formed in steps, and will become deeper upon each irradiation by a beam. A gas cushion of evaporation products formed in the score can disappear between steps. In addition, the semiconductor body is capable of cooling down between steps, so that also damage caused by heating is counteracted.

Preferably, the wafer 1 is so moved relative to the beams 14 and 15 that the beams 14 and 15 travel the same path 9 with at least 10 $\mu$s in between. The score 8 gains practically the same depth during each step in that case. The gas cushion which counteracts the formation of the score has apparently disappeared after a period of at least 10 $\mu$s, so that the evaporation can start unhampered in each step.

It is found in practice that the radiation 10 generated by a laser 11 is not fully stable. When this radiation 10 is aimed at the wafer 1 in two beams 14 and 15, two focal spots 16 and 17 are formed which are not completely stationary. The result of this is that the second laser beam 15 will not follow exactly the same path as the first laser beam 14 during the movement of the wafer 1. The score 8 formed could as a result become wider instead of deeper. This does not happen in practice, however, if the wafer is moved relative to the beams such that the beams 14 and 15 travel the same path 9 with at most 10 ms in between. The beams are apparently displaced so little in less than 10 ms that they follow substantially the same path.

The radiation 10 of the laser 11 is aimed at the wafer 1 by means of an optical system 12 which has an optical plane 18 transverse to the path 9 to be traveled, relative to which plane the radiation 10 is split up symmetrically into beams 14 and 15. The radiation is split up here into two beams 14 and 15 of equal energy and enclosing equal angles 19 with said optical plane 18. It is now possible for the wafer to be moved in opposite directions in scribing lanes 7 lying next to one another, as indicated with arrows in the broken line 9 which represents the lanes. The score 8 can be realized more quickly as a result. The symmetry achieves that the wafer 1 is irradiated in the same manner in scribing lanes lying next to one another, so that scores of equal depth are formed in both scribing lanes.

The beams 14 and 15 both account for approximately 40% of the radiated laser energy. A score 8 is formed thereby which is approximately 30% deeper than the score formed if the radiation 10 of the same laser 11 were directed at the wafer 1 in a single beam containing the full (100%) radiated laser energy.

The optical system in this example comprises a mirror 20 which deflects the radiation 90°, a binary phase diffraction grating 21 which splits the radiation beam into two beams, and a positive lens 22 with a focal distance of 50 mm which concentrates the split-up radiation onto the wafer.

FIG. 5 is a diagrammatic cross-section of the binary phase diffraction grating 21 used. The diffraction grating 21 is made of quartz glass and has a thickness of approximately 2 mm. It has a surface 23 provided with a large number of parallel grooves 24 of approximately 55 µm width and approximately 1.18 µm depth, while the interspacing between grooves 24 is approximately 55 µm. Such a diffraction grating splits up the incident beam into two beams which enclose an angle of approximately 1.1° and which each contain approximately 40% of the incident radiation energy. These beams form the first-order beams of the grating. The second-order beams, which enclose an angle of approximately 2.2°, each contain approximately 4.5% of the incident radiation. Both the first-order and the second-order beams lie symmetrically relative to the optical plane 18. Such a binary phase diffraction grating 21 is easy to manufacture and has low optical losses.

It is possible in the manner described to form a score 8 which is 15 µm wide and approximately 105 µm deep at a rate of approximately 25 cm per second. The semiconductor elements 2 may thus be quickly separated. The speed can be doubled when also radiation from a second, identical laser (not shown) is aimed at the wafer 1 in the form of at least two beams, the beams of the second laser traveling a path one after the other at an adjustable distance from and parallel to that of the beams 14 and 15 of the first laser 11. Two parallel are then formed simultaneously. The interspacing thereof should be so adjusted that the two scores are provided exactly in the lanes 7 between semiconductor elements 2.

FIG. 6 shows a device for separating the semiconductor elements according to the method of the invention in which two identical lasers are employed, corresponding elements being designated by corresponding reference numerals with the reference numerals of the second laser indicated by an accent mark ('). Here the beams 14' and 15' of the second laser 11' traveling a path one after the other at an adjustable distance from, and parallel to, that of the beams 14 and 15 of the first laser 11.

I claim:

1. A method of separating semiconductor elements formed in a wafer of semiconductor material whereby a score is formed in a surface of the wafer by local evaporation of semiconductor material through heating by means of radiation generated by a laser and directed at the laser by an optical system, the wafer being moved relative to the radiation directed thereto along a path which follows the score to be formed, characterized in that, the radiation from the laser, directed to the wafer, is split into at least two beams, while the wafer is moved relative to said beams such that said beams travel the same path one after the other and that there is least an interval between the beams, traveling the same path, sufficient to allow essentially complete evaporation, from the wafer, of the semiconductor material evaporated in said path.

2. A method as claimed in claim 1, characterized in that the wafer is moved relative to the beams such that the beams travel the same path with at least a 10 µs interval between them each time.

3. A method as claimed in claim 1, characterized in that the wafer is moved relative to the beams such that the beams travel the same path with at most a 10 ms interval between them each time.

4. A method as claimed in claim 1, characterized in that the laser radiation is aimed at the wafer by means of an optical system which has an optical plane transverse to the path to be traveled, relative to which plane the radiation is symmetrically split into beams.

5. A method as claimed in claim 1, characterized in that the laser radiation is aimed at the wafer by means of an optical system with a binary phase diffraction grating.

6. A method as claimed in claim 1, characterized in that also radiation of a second, identical laser is aimed at the wafer in the form of at least two beams, the beams of the second laser traveling a path one after the other at an adjustable distance from and parallel to that of the beams of the first laser.

7. The method of claim 1, wherein the beams possess substantially equal energy.

* * * * *